US 7,949,987 B1

(12) United States Patent
Ginetti et al.

(10) Patent No.: US 7,949,987 B1
(45) Date of Patent: May 24, 2011

(54) METHOD AND SYSTEM FOR IMPLEMENTING ABSTRACT LAYOUT STRUCTURES WITH PARAMETERIZED CELLS

(75) Inventors: Arnold Ginetti, Antibes (FR); Gilles S. C. Lamant, Sunnyvale, CA (US); Randy Bishop, Pleasanton, CA (US); Rajan Arora, Faridabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 577 days.

(21) Appl. No.: 12/028,546

(22) Filed: Feb. 8, 2008

(51) Int. Cl.
*G06F 17/50* (2006.01)

(52) U.S. Cl. ......................................... 716/139; 716/55

(58) Field of Classification Search .......... 716/1, 28–10, 716/17, 18, 55, 139
See application file for complete search history.

(56) References Cited

U.S. PATENT DOCUMENTS

| | | | |
|---|---|---|---|
| 5,511,197 A | 4/1996 | Hill et al. | |
| 5,802,349 A | 9/1998 | Rigg et al. | |
| 5,841,663 A | 11/1998 | Sharma et al. | |
| 6,735,742 B2 * | 5/2004 | Hatsch et al. | 716/2 |
| 6,857,110 B1 | 2/2005 | Rupp et al. | |
| 7,089,512 B2 | 8/2006 | Iadanza et al. | |
| 7,293,247 B1 * | 11/2007 | Newton et al. | 716/111 |
| 7,379,952 B2 * | 5/2008 | Chan et al. | 1/1 |
| 7,398,503 B2 | 7/2008 | Teig et al. | |
| 7,543,251 B2 | 6/2009 | Teig et al. | |
| 7,698,662 B1 | 4/2010 | Wu et al. | |
| 2003/0121019 A1 * | 6/2003 | Brown et al. | 716/12 |
| 2003/0229860 A1 | 12/2003 | Li | |
| 2006/0002320 A1 * | 1/2006 | Costa-Requena et al. | 370/312 |
| 2006/0095882 A1 | 5/2006 | Mankin et al. | |
| 2006/0101368 A1 | 5/2006 | Kesarwani et al. | |
| 2006/0253809 A1 | 11/2006 | Karniewicz | |
| 2006/0253827 A1 | 11/2006 | Karniewicz | |
| 2008/0133788 A1 * | 6/2008 | Inoue | 710/24 |
| 2008/0237789 A1 | 10/2008 | He et al. | |
| 2009/0007031 A1 * | 1/2009 | Ginetti et al. | 716/4 |

OTHER PUBLICATIONS

Gangwar, S. et al. "Virtuoso Express Pcells for better Interoperability and Performance on OA", from CDN live, India, 2007, pp. 1-16. http://www.cadence.com/rl/Resources/conference_papers/4.5_presentationIndia.pdf.
Non-Final Office Action dated Aug. 28, 2009 for U.S. Appl. No. 11/769,568.
Final Office Action dated Apr. 15, 2010 for U.S. Appl. No. 11/769,568.
Notice of Allowance dated Feb. 14, 2011 for U.S. Appl. No. 11/769,568.

* cited by examiner

*Primary Examiner* — Vuthe Siek
(74) *Attorney, Agent, or Firm* — Vista IP Law Group, LLP

(57) ABSTRACT

An improved method and system are disclosed for utilizing abstracted versions of layout portions in conjunction with parameterized cells (pcells). One significant advantage is that abstracted versions of pcells can be generated from normal pcells and stored in a pcell cache, which avoids the need to abstract layout pcells on the fly.

20 Claims, 5 Drawing Sheets

METHOD AND SYSTEM FOR IMPLEMENTING ABSTRACT LAYOUT STRUCTURES WITH PARAMETERIZED CELLS

FIELD

The invention relates to electronic designs, and in particular, to a system and method for implementing and using a pcell in conjunction with abstract layout structures for electronic designs.

BACKGROUND AND SUMMARY

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

The process of physical design for an IC product is intended to transform logical or circuit descriptions of the product into geometric descriptions, which are referred to as layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

Routers are a class of EDA tools that defines routes for interconnect lines that connect the pins of nets. To perform routing functions, the routing tool normally receives a previously configured layout of the IC product, e.g., a layout that was created with a "placement" tool. The layout includes numerous geometric objects for the circuit components on the IC. The routing tool will analyze the circuit components on the layout to identify and insert wiring objects to interconnect the circuit components.

To perform routing functions, a router must often work with an "abstracted" version of the layout. Abstracting a layout is the process of converting a potentially complex piece of layout design into an abstracted design, where at least some of the geometries are turned into simplified obstructions. Abstracting layout is a process which is often necessary to ease the task of some EDA engines such as the layout routers.

Working with parameterized cell (pcells) can complicate the process of implementing and using abstracted layouts. With pcells, the designer selects parameters to describe features of electronic components for a design of an integrated circuit. The pcell tool can then automatically generate multiple representations of the electronic components of the pcell based on the parameters. The parameterized data specified by the user is advantageous in that it minimizes the effort of data entry and editing in the design tool.

Any kind of layout data can be parameterized. For example, with a transistor pcell, the length, width, number of gate segments, and other design elements of the transistor, can be realized by simply inserting or changing one or more parameter values. For bipolar designs, parameterized data can include shapes such as arcs and circles. Design data can include text, and the location of the text may be relative to a virtual shape. Also, pieces of parameterized data can automatically appear, disappear, or replicate as a condition of another parameter. To generate a pcell instance, a library name, cell name, instance name, orientation, and the type and values of parameters are specified. The parameters may also be used to set a size of each parameterized cell shape.

However, conventional approaches and systems that implement pcells do not have the capability to adequately or efficiently utilize and maintain abstract pcell variants. To address this problem, embodiments of the present invention provide an improved method, system, and computer program product for utilizing abstracted versions of layout portions in conjunction with parameterized cells (pcells). Other and additional objects, features, and advantages of the invention are described in the detailed description, figures, and claims.

DETAILED DESCRIPTION

The present invention provide an improved method, system, and computer program product for utilizing abstracted versions of layout portions in conjunction with parameterized cells (pcells). One significant advantage of embodiments of the invention is that abstracted versions of pcells can generated from normal pcells and stored in a pcell cache, which avoids the need to abstract layout pcells on the fly.

The present embodiment operates by completing a layout pcell with a dummy abstract pcell, and then to abstracting variants of a layout pcell as variants of that abstract pcell. These variants are then saved within a cache of that abstract pcell. When the abstract pcell and the abstract pcell cache are saved in the cache, e.g., on disk, any piece of code reading a database containing layout pcell will be able to access the layout pcell variants, the abstract pcell variants, or both the layout pcells and abstract pcells.

Figure 1:
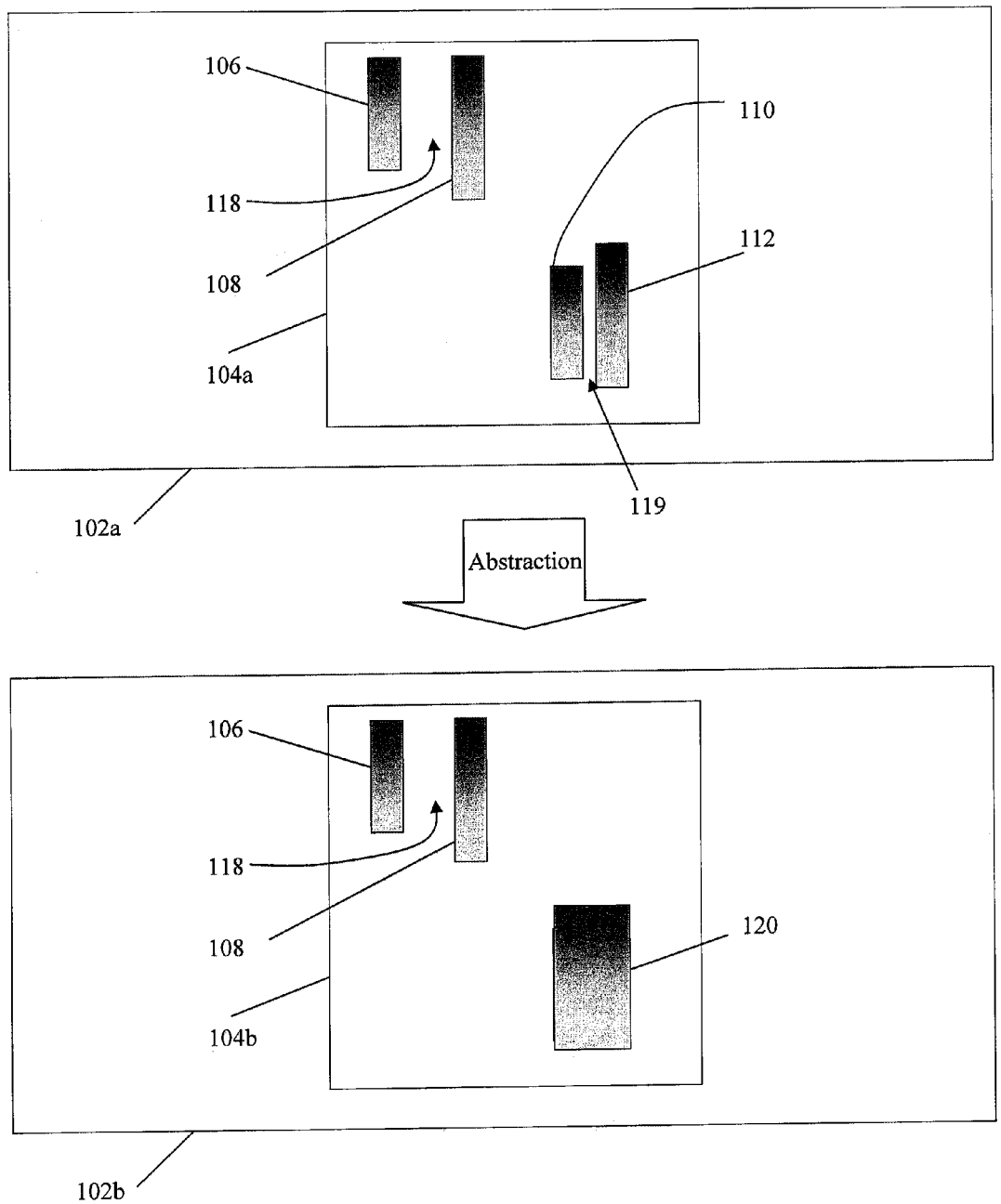
FIG. 1 illustrates a process for performing layout abstraction.

To generally explain the process for abstracting a layout, consider the example layout 102a shown in FIG. 1, which includes a cell 104a. Assume that layout 102a is the product of a placement tool just prior to processing by a routing tool. Cell 104a includes two pairs of geometric features, with the first pair of features 106 and 108 having a relatively large gap 118 between the two features. The second pair of features 110 and 112 has a relatively small gap 119 between the features.

In this example, it is assumed that gap 118 is large enough such that a routing object (e.g., a wire or via) could potentially be placed within gap 118 by a router without violating design rules or other required manufacturing constraints. It is further assumed that gap 119 is small enough such that it would not be possible to include an routing object within gap 119 and still maintain compliance with necessary design rules or other required manufacturing tolerances.

In this circumstance, the version of the layout 102a that is used by a routing tool would not necessarily need to see objects 110 and 112 as individual geometric features. This is because the routing tool, even if it has this level of detail in the layout information, could not make any use for this level of detail to provide routing paths between the two objects 110 and 112.

Instead, the routing tool could operate using an abstracted version of the layout 102b having an abstracted cell 104b that represents individual objects 110 and 112 as a single abstracted obstruction 120. The advantage with this approach is that the amount of data that is analyzed by the routing tool is greatly reduced by removing unnecessary details from the layout. Depending upon the number of objects that can be abstracted, the speed, cost, and efficiency of the routing tool can be tremendously improved.

It is noted that objects 106 and 108 would not be represented by an abstracted obstruction in the abstracted cell 104b. This is because gap 118 between objects 106 and 108 is large enough such that the routing tool can potentially insert a routing object within gap 118. As a result, the level of detail for abstracted layout 104b should be sufficient to maintain objects 110 and 112 as individual objects.

For conventional EDA systems, this process for utilizing abstracted cells is difficult to implement when working with pcells. As noted above, a pcell is an element of an electronic design which has content that is dynamically created based on a set of parameters. The attributes of a pcell are a piece of code in a given language, a list of parameter types and default value and an evaluator.

Figure 2:
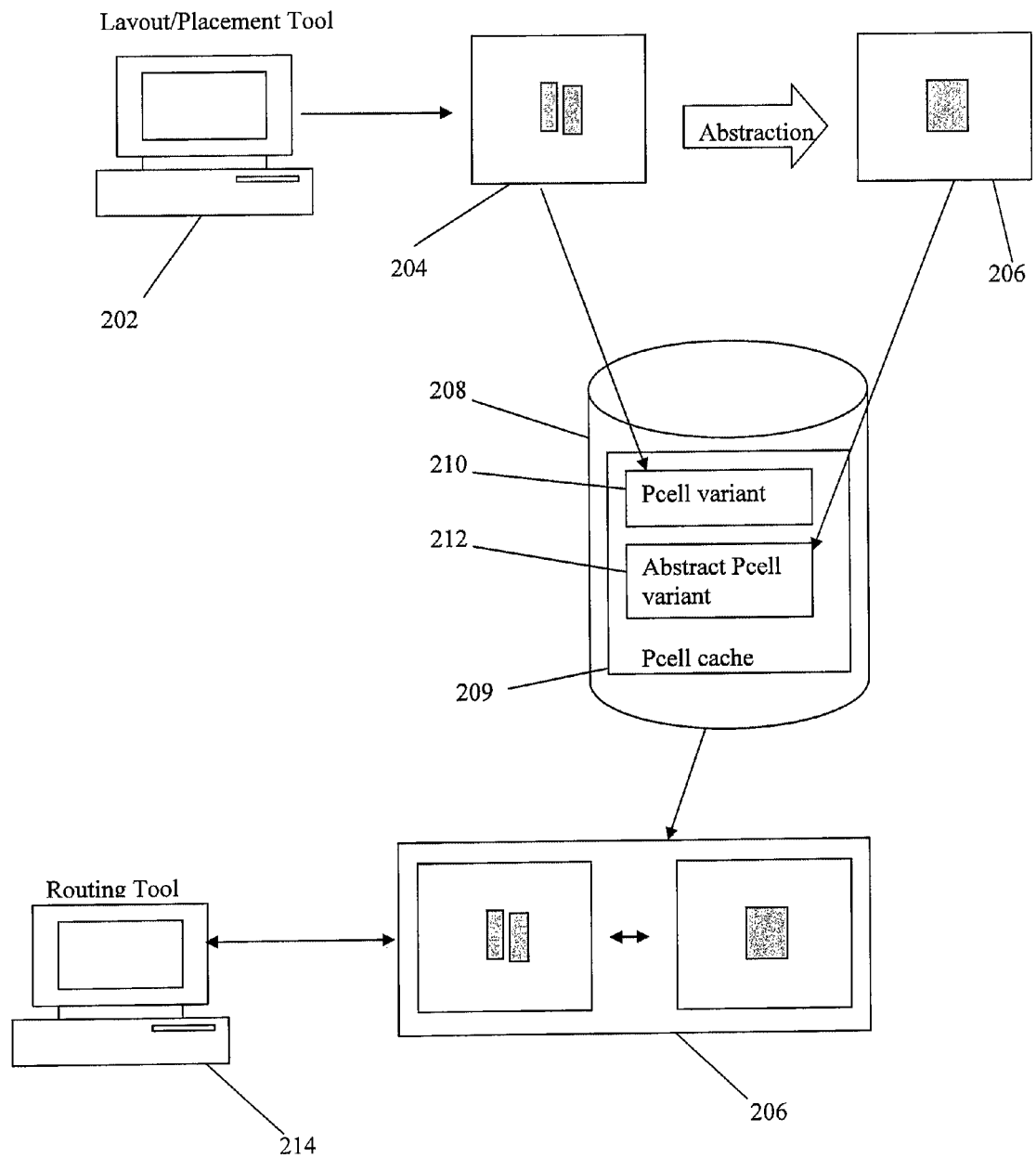
FIG. 2 shows a system for implementing layout abstraction with pcells.

Referring to FIG. 2, embodiments of the present invention provide an improved method and system that facilitates the generation, use, and maintaining of abstracted cells in a layout. A layout or placement tool 202 will generate a layout having one or more pcells, e.g., a pcell variant 204 that corresponds to a given set of geometric layout features.

A pcell variant 204 is an instance of a pcell, e.g., an instance of a pcell "supermaster" decorated with particular pcell parameter values. The pcell instance can be evaluated by evaluating the pcell code against the instance parameters, e.g., with the assistance of a pcell evaluator, to produce a new non-persistent pcell element for the design, which can be referred to as a pcell "submaster."

That pcell variant 204 can be abstracted to form an abstracted version 206 of that pcell variant 204. As previously described, the process of abstracting a layout involves converting a potentially complex piece of layout design into an abstracted design, where most of the geometries are turned into simplified obstructions. The abstracted version 206 of the pcell variant 204 is a variation of the pcell that has been abstracted to contain information retained for relevance to a downstream tool, e.g., routing tool 214.

Both the pcell variant 204 and the abstracted pcell variant 206 can be cached into a pcell cache 209 in database 208. The pcell variant 204 is stored as cached object 210 and the abstract pcell variant 206 is stored as cached object 212 in the pcell cache 209 in database 208. The database 208 generally includes information that may assist the analysis and simulation of the chip design. In an embodiment, the design database is an OpenAccess database, although any suitable database may be used depending on the application. One example approach for caching pcell content is described in co-pending U.S. application Ser. No. 11/769,568, filed on Jun. 27, 2007, entitled "METHOD AND SYSTEM FOR IMPLEMENTING CACHED PARAMETERIZED CELLS," which is hereby incorporated by reference in its entirety.

A routing tool 214 can then perform routing functions based upon either the pcell variant 204 or the abstract pcell variant 206. In particular, if the routing tool 214 wishes to use the original un-abstracted pcell variant 204, then it merely needs to access the cached pcell variant 204 at cache location 210. If the routing tool 214 wishes to use the abstract pcell variant 206, then it merely needs to access the cached abstract pcell variant 206 at cache location 212.

This approach is useful for many different types of design activities, such as the activity of performing dynamic re-mastering. Dynamic re-mastering is the process of automatically switching views when reading a design. For example, when a router reads a design 206, when it encounters an instance of layout cellview, it can decide to read the abstract cell instead of the layout cellview. Such a process can be automatically performed with pcells when using embodiments of the present invention, merely by accessing the pcell variants and abstract pcell variants within pcell cache 209.

This is in contrast to conventional systems that do not realistically allow dynamic re-mastering for pcells, since conventional systems will require code within the pcell to be abstracted on-the-fly, which is a very complex and potentially impossible task depending upon the design.

Another possible variation to the invention is to save abstracted variants of layout pcell variants as regular cells. Such an approach requires to the abstracted pcell variants to be named, as well as passing of those names (e.g., as a map file or by convention) to the application requesting those abstracts. A significant drawback is that this approach requires production of many regular cellViews within the design library as well as some code dependency in between the abstraction application and the application requesting abstracted pcells.

Yet another possible variation to the invention is to statically re-mastering layout pcell instances into their abstracted variants as regular cells. The main drawback of that solution is the fact that the new regular cells in the design does not correspond to pcells anymore, and therefore an opposite re-mastering will be needed later for any application requesting layout pcell variants.

Figure 3:
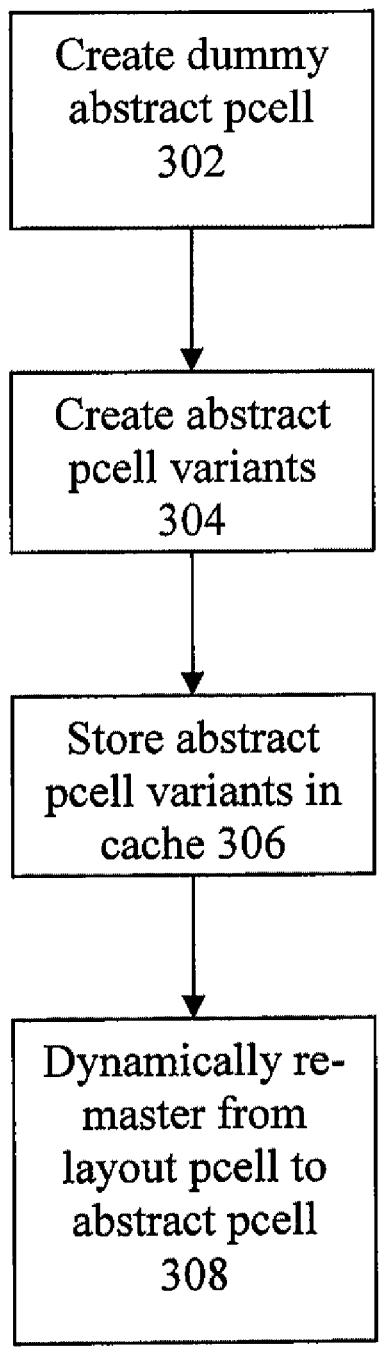
FIG. 3 illustrates a flow diagram of a method for implementing layout abstraction with pcells.

FIG. 3 shows a flowchart of for an embodiment of the current invention for maintaining a pcell as a pcell during the process of abstraction. The present embodiment operates by completing a layout pcell with a dummy abstract pcell, and abstracting variants of a layout pcell as variants of that abstract dummy pcell. These variants are saved within a cache of that abstract pcell.

At 302, the method creates a dummy abstract pcell that corresponds to a layout pcell. The first step is straightforward in that it is implemented by completing a layout pcell with an abstract pcell having several characteristics. The abstract pcell will be named with the same library name as the layout pcell. In addition, abstract pcell with have the same cell name as the layout pcell. An "abstract" view name will be created, which alternatively can be any other name which is be passed to the dynamic re-mastering action. Depending upon specific configurations, the abstract pcell may need to be created by the layout pcell developer, as it may need to be installed in the layout pcell library.

In some embodiments, an error marker will be generated for the dummy abstract pcell, e.g., as a "5 by 5" error marker. Within the current embodiment, this error marker is implemented as SKILL code, although it can be implemented in alternate embodiments as any code supported by a pcell evaluator. The rationale for creating this error marker will be explained with respect to the discussion of 306 below.

At 304, abstract pcell variants are created. Any suitable approach can be taken to create the abstract pcell variants. In some approaches, a layout abstractor is used to create the abstract pcell variants. The layout abstractor will abstract variants for some or all of the layout pcells within a given design as variants of the associated abstract pcell.

At 306, the abstract pcell variants are stored within a pcell cache. One approach for implementing and storing pcells within a pcell cache is described in U.S. application Ser. No. 11/769,568, filed on Jun. 27, 2007, entitled "METHOD AND SYSTEM FOR IMPLEMENTING CACHED PARAMETERIZED CELLS," which is hereby incorporated by reference in its entirety.

An explanation will now be given for the embodiment in which the abstract pcell code creates an error marker in the dummy abstract pcell. The reason is that in the case an abstract pcell is instantiated within a design while no cached version exists for that abstract pcell (or a cache exists, but it does not contain the right variant), the code of that pcell will be evaluated. By implementing the code to create an error marker, one can easily inform the user of the mistake.

At 308, dynamic re-mastering can be performed from layout pcell to abstract pcell. This is performed by configuring the application that requests the abstract pcell to dynamically open abstract pcell variant instead of layout pcell variant.

For example, with respect to applications that operate in conjunction with the OpenAccess database, this will cause OpenAccess to dynamically load a pcell plug-in to visit the abstract cache and obtain the appropriate abstract variant from the pcell cache.

Figure 4:
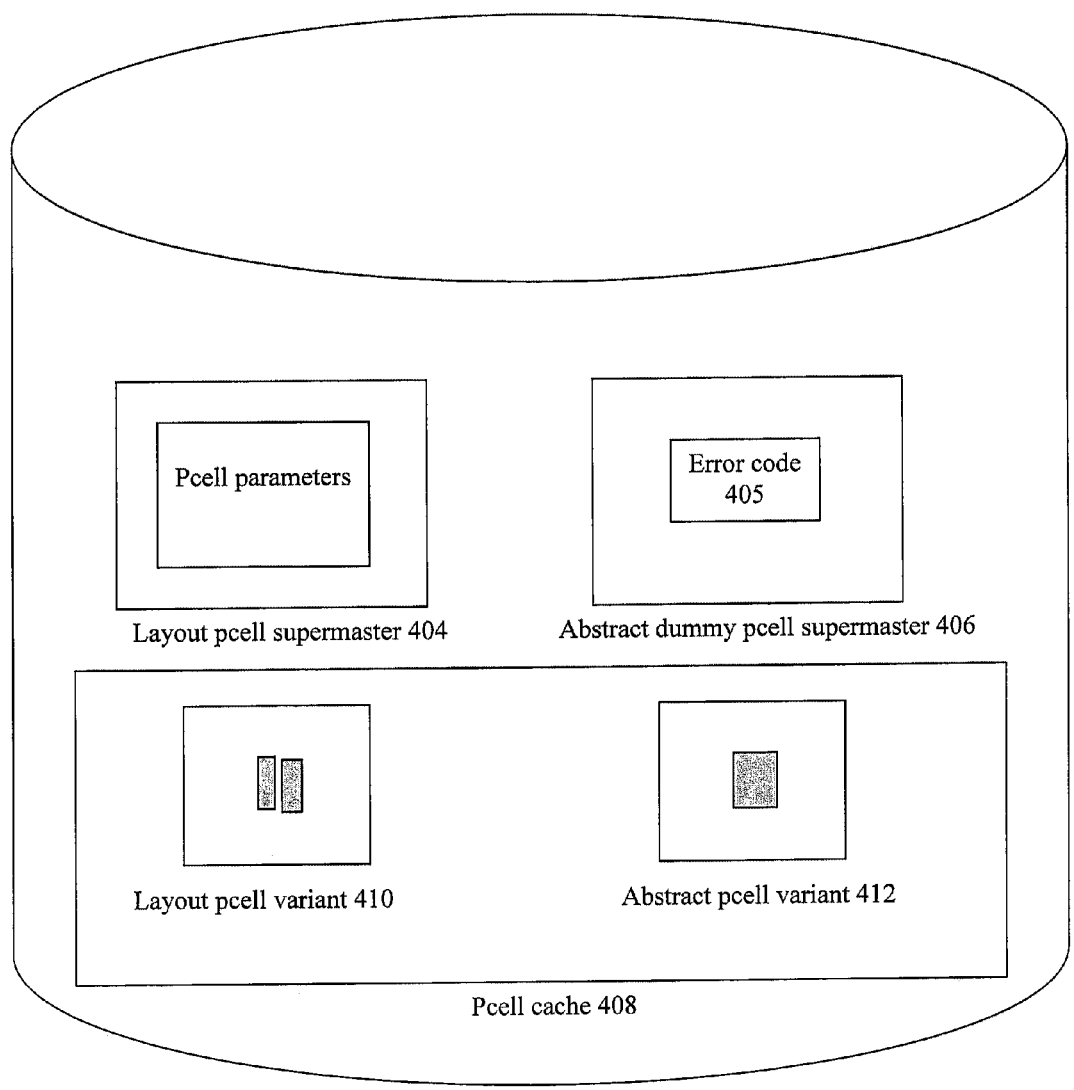
FIG. 4 depicts structures utilized with the flow diagram of FIG. 3.

FIG. 4 illustrates the structures referred to with respect to the process of FIG. 3. The layout pcell supermaster 404 is the supermaster for the layout pcell that was designed by the designer. A pcell instance can be evaluated by evaluating the pcell code against the instance parameters to produce a new non-persistent pcell element for the design, which is a pcell variant submaster 410. The layout pcell variant 410 is stored within a pcell cache 408. The pcell cache may be implemented as either persistent or non-persistent storage.

An abstract dummy pcell supermaster 406 is created which corresponds to the layout pcell supermaster 404. The abstract dummy pcell supermaster 406 comprises error code 405 to alert users if an abstract pcell is instantiated within a design while no cached version exists for that abstract pcell.

Abstract pcell variants 412 are created as needed that correspond to the layout pcell variants 410. The abstract pcell variants 412 are also stored in pcell cache 408.

Therefore, what has been described is an invention for maintaining a pcell as a pcell during the process of abstraction. As noted, such an abstraction process is often necessary for some application such as layout routers. The present approach can be used to easily access layout design information only, abstract design information only, or a combination of both layout information and abstract design information.

Figure 5:
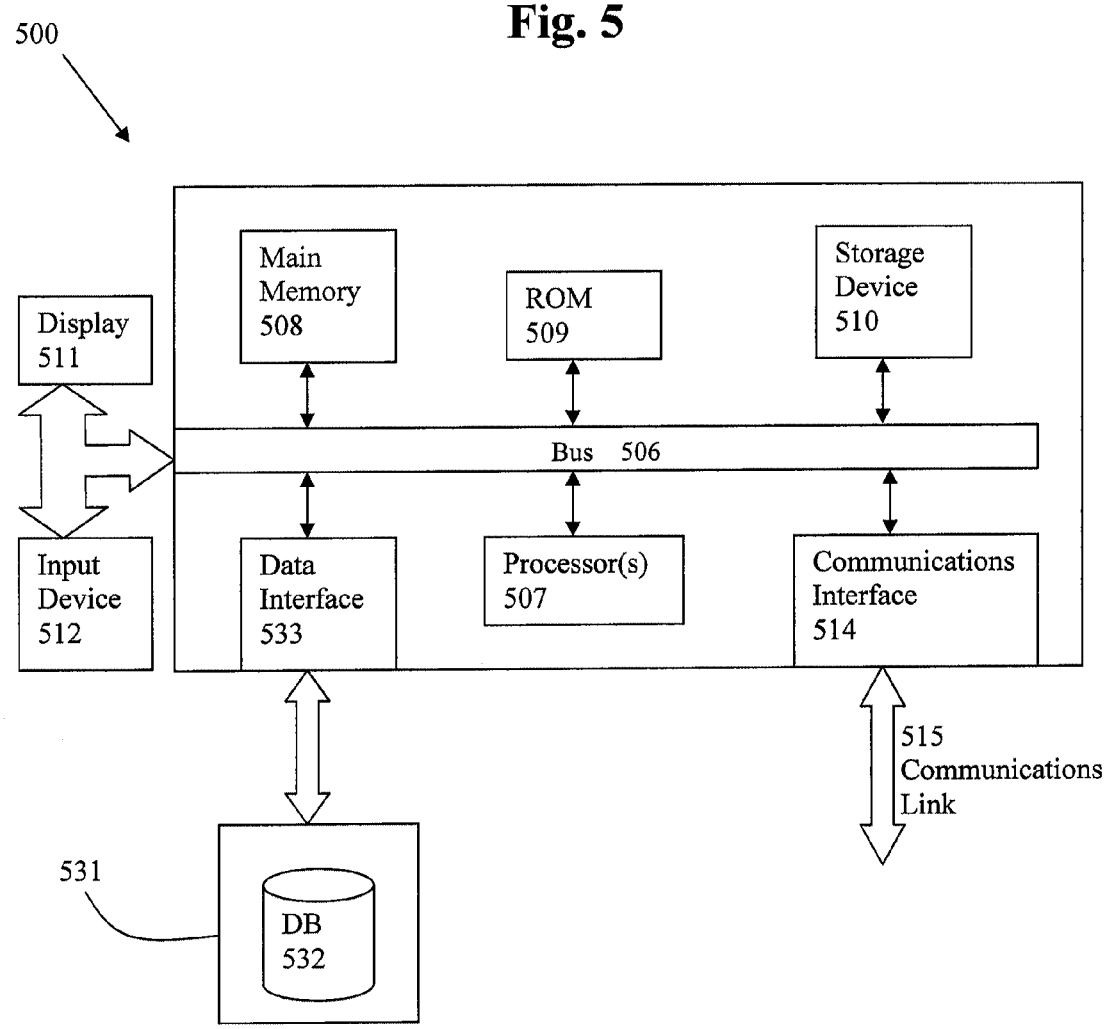
FIG. 5 depicts a computerized system with which layout abstraction with pcells can be implemented.

FIG. 5 depicts a computerized system on which a method for caching pcells can be implemented. The execution of the sequences of instructions required to practice the embodiments may be performed by a computer system 500 as shown in FIG. 5. In an embodiment, execution of the sequences of instructions is performed by a single computer system 500. According to other embodiments, two or more computer systems 500 coupled by a communication link 515 may perform the sequence of instructions in coordination with one another. Although a description of only one computer system 500 will be presented below, however, it should be understood that any number of computer systems 500 may be employed to practice the embodiments.

A computer system 500 according to an embodiment will now be described with reference to FIG. 5, which is a block diagram of the functional components of a computer system 500. As used herein, the term computer system 500 is broadly used to describe any computing device that can store and independently run one or more programs.

Each computer system 500 may include a communication interface 514 coupled to the bus 506. The communication interface 514 provides two-way communication between computer systems 500. The communication interface 514 of a respective computer system 500 transmits and receives electrical, electromagnetic or optical signals, which include data streams representing various types of signal information, e.g., instructions, messages and data. A communication link 515 links one computer system 500 with another computer system 500. For example, the communication link 515 may be a LAN, in which case the communication interface 514 may be a LAN card, or the communication link 515 may be a PSTN, in which case the communication interface 514 may be an integrated services digital network (ISDN) card or a modem, or the communication link 515 may be the Internet, in which case the communication interface 514 may be a dial-up, cable or wireless modem.

A computer system 500 may transmit and receive messages, data, and instructions, including program, i.e., application, code, through its respective communication link 515 and communication interface 514. Received program code may be executed by the respective processor(s) 507 as it is received, and/or stored in the storage device 510, or other associated non-volatile media, for later execution.

In an embodiment, the computer system 500 operates in conjunction with a data storage system 531, e.g., a data storage system 531 that contain a database 532 that is readily accessible by the computer system 500. The computer system 500 communicates with the data storage system 531 through a data interface 533. A data interface 533, which is coupled to the bus 506, transmits and receives electrical, electromagnetic or optical signals, which include data streams representing various types of signal information, e.g., instructions, messages and data. In embodiments, the functions of the data interface 533 may be performed by the communication interface 514.

Computer system 500 includes a bus 506 or other communication mechanism for communicating instructions, messages and data, collectively, information, and one or more processors 507 coupled with the bus 506 for processing information. Computer system 500 also includes a main memory 508, such as a random access memory (RAM) or other dynamic storage device, coupled to the bus 506 for storing dynamic data and instructions to be executed by the processor(s) 507. The main memory 508 also may be used for storing temporary data, i.e., variables, or other intermediate information during execution of instructions by the processor(s) 507.

The computer system 500 may further include a read only memory (ROM) 509 or other static storage device coupled to the bus 506 for storing static data and instructions for the processor(s) 507. A storage device 510, such as a magnetic disk or optical disk, may also be provided and coupled to the bus 506 for storing data and instructions for the processor(s) 507.

A computer system 500 may be coupled via the bus 506 to a display device 511, such as, but not limited to, a cathode ray tube (CRT), for displaying information to a user. An input device 512, e.g., alphanumeric and other keys, is coupled to the bus 506 for communicating information and command selections to the processor(s) 507.

According to one embodiment, an individual computer system 500 performs specific operations by their respective processor(s) 507 executing one or more sequences of one or more instructions contained in the main memory 508. Such instructions may be read into the main memory 508 from another computer-usable medium, such as the ROM 509 or the storage device 510. Execution of the sequences of instructions contained in the main memory 508 causes the processor(s) 507 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 507. Such a medium may take many forms, including, but not limited to, non-volatile and/or volatile media. Non-volatile media, i.e., media that can retain information in the absence of power, includes the ROM 509, CD ROM, magnetic tape, and magnetic discs. Volatile media, i.e., media that can not retain information in the absence of power, includes the main memory 508.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than in a restrictive sense.

The invention claimed is:

1. A method for implementing abstract parameterized cells (pcells) for an electronic circuit design, comprising:
   creating, by using a processor, one or more abstract parameterized cell variants that correspond to layout parameterized cell variants, wherein the one or more abstract parameterized cell variants are converted from the layout parameterized cell variants, where geometries of the layout parameterized cell variants are turned into simplified obstructions;
   storing the one or more abstract parameterized cell variants that correspond to the layout parameterized cell variants in a parameterized cell cache, wherein the parameterized cell cache comprises a non-transitory computer readable storage medium that is either persistent or non-persistent; and
   performing an operation with an electronic design automation tool that implements dynamic remastering, in which the electronic design automation tool performs dynamic remastering from the layout parameterized cell variant to the abstract parameterized cell variant.

2. The method of claim 1 in which the dynamic remastering from the layout parameterized cell variant to the abstract parameterized cell variant is performed without generating the abstract parameterized cell variant in real-time.

3. The method of claim 1 further comprising:
   creating a dummy abstract parameterized cell master that corresponds to a layout parameterized cell master, wherein the layout parameterized cell variants are instances of the layout parameterized cell master.

4. The method of claim 3 in which the dummy abstract parameterized cell master comprises error code.

5. The method of claim 1 in which the one or more abstract parameterized cell variants corresponds to an abstract version of obstructions within the layout parameterized cell variants.

6. The method of claim 5 in which the abstract version of the obstructions correspond to removal of detail data which is of irrelevance to the electronic design automation tool.

7. The method of claim 1 in which dynamic remastering from the layout parameterized cell variant to the abstract parameterized cell variant is performed by loading a parameterized cell plug-in to obtain an appropriate abstract variant from the parameterized cell cache.

8. A system for implementing abstract parameterized cells (pcells) for an electronic circuit design, comprising:
   a non-transitory computer readable storage medium for storing one or more abstract parameterized cell variants that correspond to layout parameterized cell variants in a parameterized cell cache, wherein the one or more abstract parameterized cell variants are converted from the layout parameterized cell variants, where geometries of the layout parameterized cell variants are turned into simplified obstructions; and
   an electronic design automation tool, having a processor, that implements dynamic remastering, in which the electronic design automation tool implements dynamic remastering from the layout parameterized cell variant to the abstract parameterized cell variant.

9. The system of claim 8 in which the dynamic remastering from the layout parameterized cell variant to the abstract parameterized cell variant is implemented without generating the abstract parameterized cell variant in real-time.

10. The system of claim 8 further comprising:
    a dummy abstract parameterized cell master that corresponds to a layout parameterized cell master, wherein the layout parameterized cell variants are instances of the layout parameterized cell master.

11. The system of claim 10 in which the dummy abstract parameterized cell master comprises error code.

12. The system of claim 8 in which the one or more abstract parameterized cell variants corresponds to an abstract version of obstructions within the layout parameterized cell variants.

13. The system of claim 12 in which the abstract version of the obstructions correspond to removal of detail data which is of irrelevance to the electronic design automation tool.

14. The system of claim 8 in which dynamic remastering from the layout parameterized cell variant to the abstract parameterized cell variant is implemented by loading a parameterized cell plug-in to obtain an appropriate abstract variant from the parameterized cell cache.

15. A computer program product comprising a non-transitory computer usable medium having executable code to execute a process, by using a processor, for implementing abstract parameterized cells (pcells) for an electronic circuit design, comprising:

creating one or more abstract parameterized cell variants that correspond to layout parameterized cell variants, wherein the one or more abstract parameterized cell variants are converted from the layout parameterized cell variants, where geometries of the layout parameterized cell variants are turned into simplified obstructions;

storing the one or more abstract parameterized cell variants that correspond to the layout parameterized cell variants in a parameterized cell cache, wherein the parameterized cell cache comprises a computer readable medium that is either persistent or non-persistent; and performing an operation with an electronic design automation tool that implements dynamic remastering, in which the electronic design automation tool performs dynamic remastering from the layout parameterized cell variant to the abstract parameterized cell variant.

16. The computer program product of claim 15 in which the dynamic remastering from the layout parameterized cell variant to the abstract parameterized cell variant is performed without generating the abstract parameterized cell variant in real-time.

17. The computer program product of claim 15 further comprising:

creating a dummy abstract parameterized cell master that corresponds to a layout parameterized cell master, wherein the layout parameterized cell variants are instances of the layout parameterized cell master in which the dummy abstract parameterized cell master comprises error code.

18. The computer program product of claim 15 in which the one or more abstract parameterized cell variants corresponds to an abstract version of obstructions within the layout parameterized cell variants.

19. The computer program product of claim 18 in which the abstract version of the obstructions correspond to removal of detail data which is of irrelevance to the electronic design automation tool.

20. The computer program product of claim 15 in which dynamic remastering from the layout parameterized cell variant to the abstract parameterized cell variant is performed by loading a parameterized cell plug-in to obtain an appropriate abstract variant from the parameterized cell cache.

* * * * *